United States Patent [19]
Wu

[11] Patent Number: 5,851,897
[45] Date of Patent: Dec. 22, 1998

[54] METHOD OF FORMING A DRAM CELL WITH A CROWN-FIN-PILLAR STRUCTURE CAPACITOR

[75] Inventor: Shye Lin Wu, Hsinchu, Taiwan

[73] Assignee: Powerchip Semiconductor Corp., Taiwan

[21] Appl. No.: 752,194

[22] Filed: Nov. 18, 1996

[51] Int. Cl.⁶ .............................................. H01L 21/8242
[52] U.S. Cl. ............................................ 438/397; 438/254
[58] Field of Search .................................... 438/253, 254, 438/396, 397, 212, 220, 430; 257/307, 308; 148/DIG. 14

[56] References Cited

U.S. PATENT DOCUMENTS

| | | | |
|---|---|---|---|
| 5,053,351 | 10/1991 | Fazan et al. ............................. | 438/397 |
| 5,164,337 | 11/1992 | Ogawa et al. ........................... | 438/254 |
| 5,170,233 | 12/1992 | Liu et al. ................................. | 257/308 |
| 5,196,365 | 3/1993 | Gotou ....................................... | 438/254 |
| 5,240,871 | 8/1993 | Doan et al. .............................. | 438/397 |
| 5,543,346 | 8/1996 | Keum et al. ............................. | 438/397 |
| 5,637,523 | 6/1997 | Fazan et al. ............................. | 438/397 |
| 5,656,536 | 8/1997 | Wu ........................................... | 438/397 |
| 5,716,884 | 2/1998 | Hsue et al. ............................... | 438/254 |
| 5,766,994 | 6/1998 | Tseng ....................................... | 438/253 |
| 5,770,499 | 6/1998 | Kwok et al. ............................. | 438/253 |

Primary Examiner—Peter Toby Brown
Assistant Examiner—Toniae M. Thomas
Attorney, Agent, or Firm—Pennine & Edmonds, LLP

[57] ABSTRACT

The present invention is a method of manufacturing a high density capacitors for use in semiconductor memories. High etching selectivity between BPSG (borophososilicate glass) and CVD-oxide (chemical vapor deposition oxide) is used to fabricate a crown shape capacitor with a plurality of horizontal fins. First, a first polysilicon layer is formed on a semiconductor substrate. A composition layer consists of BPSG and silicon oxide formed on a the first polysilicon layer. Then a contact hole is formed in the composition layer and the first polysilicon layer. A highly selective etching is then used to etch the BPSG sublayers of the composition layer. Next, a second polysilicon layer is formed in the contact hole and the composition layer. Then photolithgraphy and etching process is used to etch the second polysilicon layer, composition layer and first polysilicon layer. A third polysilicon layer is subsequently formed on the second polysilicon layer. An anisotropic etching is performed to etching the second and the third polysilicon layer. Then the composition layer is removed by BOE solution. A dielectric film is then formed along the surface of the first, second and third polysilicon layer. Finally, a forth polysilicon layer is formed on the dielectric film. Thus, a capacitor with a plurality of horizontal fins is formed.

36 Claims, 5 Drawing Sheets

METHOD OF FORMING A DRAM CELL WITH A CROWN-FIN-PILLAR STRUCTURE CAPACITOR

FIELD OF THE INVENTION

The present invention relates to semiconductor capacitors, and more specifically, to a method of making a crown-fin-pillar structure capacitor.

BACKGROUND OF THE INVENTION

In order to achieve high performance (i.e. high density), memory cells in DRAM technology must be scaled down to the submicrometer range. Thus, as the capacity of DRAMs has increased, the size of the memory cells must steadily decrease. Great progress has been made in the manufacture of dynamic random access memory (DRAM) using high density integrated circuit technology. A memory cell for each bit to be stored by the semiconductor DRAM typically consists of a storage capacitor and an access transistor. Either the source or drain of the transistor is connected to one terminal of the capacitor. The other side of the transistor and the transistor gate electrode are connected to external connection lines called a bit line and a word line, respectively. The other terminal of the capacitor is connected to a reference voltage. Thus, the formation of a DRAM memory cell comprises the formation of a transistor, a capacitor and contacts to external circuits. The capacitor type that is most typically used in DRAM memory cells are planar capacitors, which are relatively simple to manufacture. With the advent of Ultra Large Scale Intergrated (ULSI)DRAM devices, the sizes of memory cells has gotten smaller and smaller such that the area available for a single memory cell has become very small. This has caused a reduction in capacitor area, which in turn results in a reduction in cell capacitance. The reduction in memory cell area is required for high density DRAMs. This causes reduction in capacitor area, resulting in the reduction of cell capacitance. For very small memory cells, planar capacitors become very difficult to use reliably. Specifically, as the size of the capacitor decreases, the capacitance of the capacitor also decreases. Similarly, the size of the charge capable of being stored by the capacitor decreases. This results in the capacitor being very susceptible to $\alpha$ a particle radiation. Additionally, as the capacitance decreases, the charge held by storage capacitor must be refreshed often. A simple stacked capacitor can not provide sufficient capacitance, even with high dielectric $Ta_2O_5$ films as the capacitor insulator.

Prior art approaches to overcoming these problems have resulted in the development of the trench capacitor (see for example U.S. Pat. No. 5,374,580) and the stacked capacitor. The trench capacitor has the well-known problem of "gated diode leakage," which is the leakage of current resulting in the trench capacitor failing to hold a charge. Reducing the thickness of the dielectric also can improve the capacitance of the capacitor, but this approach is limited because of yield and reliability problems.

A capacitor-over-bit-line (COB) cell with a hemispherical-grain (HSG) polysilicon storage node has been developed (see "A CAPACITOR-OVER-BIT-LINE CELL WITH HEMISPHERICAL-GRAIN STORGE NODE FOR 64 Mb DRAMs", M. Sakao etc. microelectronics research laboratories, NEC Corporation). The HSG-Si is depositioned by low pressure chemical vapor deposition method at the transition temperature from amorphous—Si to polycrystalline—Si. Further, a cylindrical capacitor using HemisphericalGrained Si havs been proposed (see "A NEW CYLIDRICAL CAPACITOR USING HEMISPHERICAL GRAINED Si FOR 256 Mb DRAMs", H. Watanabe et al., Tech Dig,Dec. 1992, pp.259–262).

SUMMARY OF THE INVENTION

A dielectric layer for isolation is formed over a substrate. A nitride layer is subsequently formed on the dielectric layer. A first conductive layer is subsequently deposited on the nitride layer. A composition layer consisting of alternating BPSG layers and silicon dioxide layers is formed on the first conductive layer. The composition layer is formed on the first conductive layer repeatedly by deposition.

A contact hole is formed by well known technology. Next, a highly selective etching process is then used to removed a portion of the BPSG layers. In preferred embodiment, the selective etching step utilizes a low pressure HF vapor to selectively etch the BPSG layers and silicon dioxide layers . The relative susceptibility to etching of the BPSG layers to the silicon dioxide layers is about 2000 to 1. A second conductive layer is then deposited over the composition layer. Next, a photoresist is patterned on the second conductive layer. An etching is used to etch the compositon layer, the first polysilicon layer, the nitride layer and the dielectric layer to the surface of the first conductive layer. Then the second photoresist is removed away.

Next, a third conductive layer is subsequently formed on the composition layer and the first conductive layer and then etched back to form conductive layer spacer. Then the BPSG layers and the silicon dioxide layers are removed to form a crown shape with a plurality of horizontal fins. The next step of the formation is to deposite a dielectric film along the surface of the first conductive layers, the second conductive layers and the third conductive layers. A forth conductive layer is deposited over the dielectric film. The forth conductive layer is used as the top storage node.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention relates to a method of making a high dendity memory cell for DRAM, which has a enlarge surface area of the capacitor to increase the performance of the memory cell. Further, the present invention uses high etching selectivity (higher than 2000:1) between BPSG (borophosphosilicate glass) and CVD silicon dioxide to form multi-fin capacitor structure. As will be seen below, this technique can be used to create a crown shape capacitor with a plurality of horizontal fins. The detail processes will be described as follows.

Figure 1:
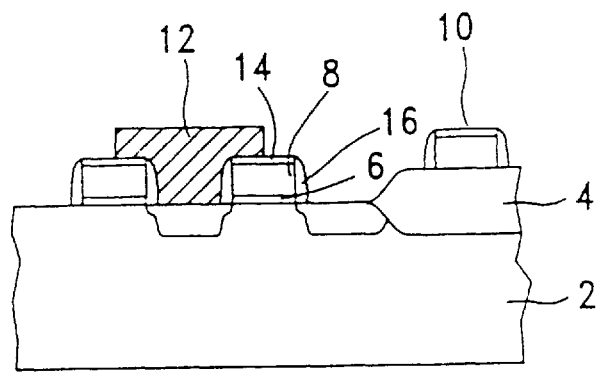
FIG. 1 is a cross section view of a semiconductor wafer illustrating the step of forming a gate structure on a semiconductor substrate.

Referring to FIG. 1, a single crystal P-type substrate 2 with a <100> crystallographic orientation is used for the preferred embodiment. A thick field oxide region 4, FOX 4, is created for the purposes of isolation. Generally speaking, the FOX 4 region is created via photolithography and dry etching steps to etch a silicon nitride-silicon dioxide composite layer. After the photoresist is removed and wet cleaned, a thermal oxidation in an oxygen-steam ambient is used to form the FOX 4 region, to a thickness of about 3000–8000 angstroms.

Initially, a silicon dioxide layer 6 is created atop the substrate 2 to use as a gate oxide. In the preferred embodiment, the silicon dioxide layer 6 is formed by using an oxygen-steam ambient, at a temperature between about 750° to 1100° C. Alternatively, the gate oxide 6 may be formed using other known oxide chemical compositions and procedures. As is known in the art, the silicon dioxide layer 4 can be formed by using chemical vapor deposition (CVD) process, using TEOS as a source at a temperature between about 600° to 800° C., at a pressure 0.1 to 10 torrs. In the preferred embodiment, the thickness of the silicon dioxide layer 6 is approximately 30–200 angstroms.

Still referring to FIG. 1, after the first silicon dioxide layer 6 is formed, a first polysilicon layer 8 is formed over the silicon dioxide layer 6 and the field oxide regions 4. In the preferred embodiment, the first polysilicon layer 8 is formed by using conventional chemical vapor deposition (CVD) to have a thickness about 1000–5000 angstroms. Then, a word line 10, a bit line 12, gate structures with cap layer 14, and side wall spacers 16, are formed by well known technology and is not particularly germane to the present invention. Thus, only a cursory description of the formation of gate structure is given here.

Figure 2:
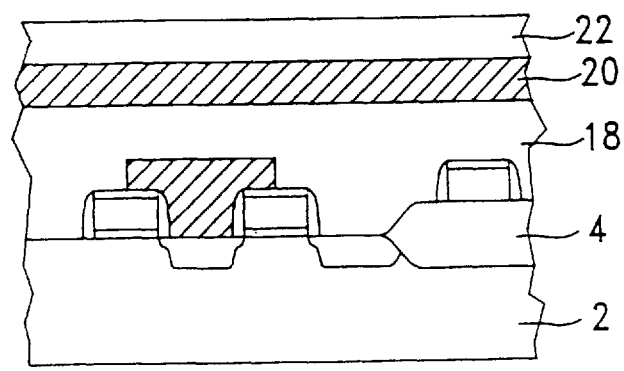
FIG. 2 is a cross section view of a semiconductor wafer illustrating the step of forming a dielectric layer, a nitride layer and a first conductive layer on the semiconductor substrate.

As shown in FIG. 2, a dielectric layer 18 for isolation is formed on the gate structures, FOX 4 and substrate 2 to a thickness about 3000–10000 angstroms. The dielectric layer 18 is preferably formed of silicon oxide. A nitride layer 20 is subsequently formed on the dielectric layer 18. The nitride layer 20 is used as an etching barrier to prevent the dielectric layer 18 from etching for later process. The nitride layer 20 has a thickness at a range about 300–2000 angstroms. A first conductive layer is subsequently deposited on the nitride layer 20 to a thickness about 300–3000 angstroms.

Preferably, the first conductive layer 22 can be formed using doped polysilicon, in-situ doped polysilicon or metal such as aluminum, copper, tungsten, titanium, silicide, PtSi, Wsi, $TiSi_2$ or $CoSi_2$.

Figure 3:
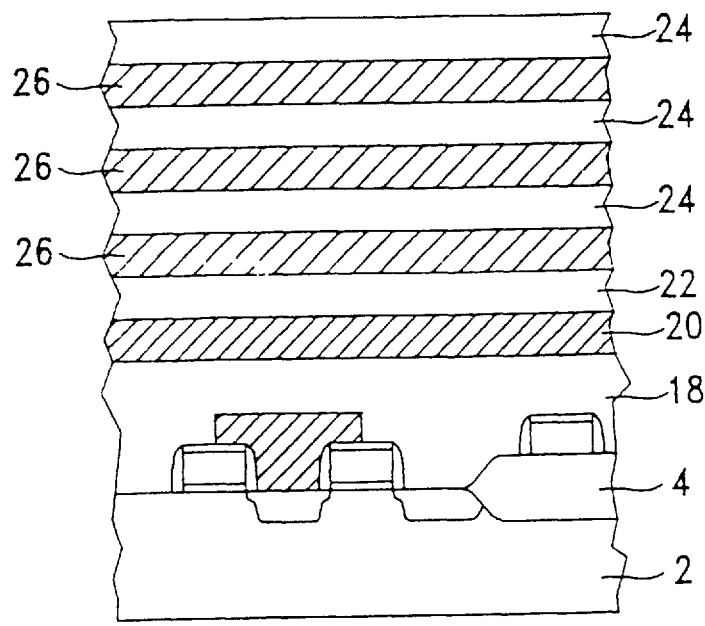
FIG. 3 is a cross section view of a semiconductor wafer illustrating the step of forming a composition layer consisting of alternating BPSG (borophosphosilicate glass) layers and CVD-oxide (chemical vapor deposition oxide) layers on the first conductive layer.

Turning next to FIG. 3, a composition layer consisting of alternating BPSG layers 24 and silicon dioxide layers 26 is formed on the first conductive layer 22. The composition layer is formed on the first conductive layer 22 repeatedly by deposition. The composition layers are composed of odd layers and even layers. The odd layers may be silicon dioxide layers and the even layers may be BPSG, or alternatively, the odd layers may be BPSG and the even layers may be silicon dioxide layers. The BPSG layers 24 can be formed by low pressure chemical vapor deposition using tetraethylorthosilicate (TEOS) as a reactant. Boron and phosphorus are added during the formation of the borophosphosilicate glass layer. The thickness of the BPSG layers is 300 to 1000 angstroms. The silicon dioxide layers 26 can be formed by any suitable process auch as chemical vapor deposition process, using TEOS as a source at a temperature between about 600° to 800° C., at a pressure of 1 to 10 torrs, and to a thickness about 300 to 1000 angstroms.

Figure 4:
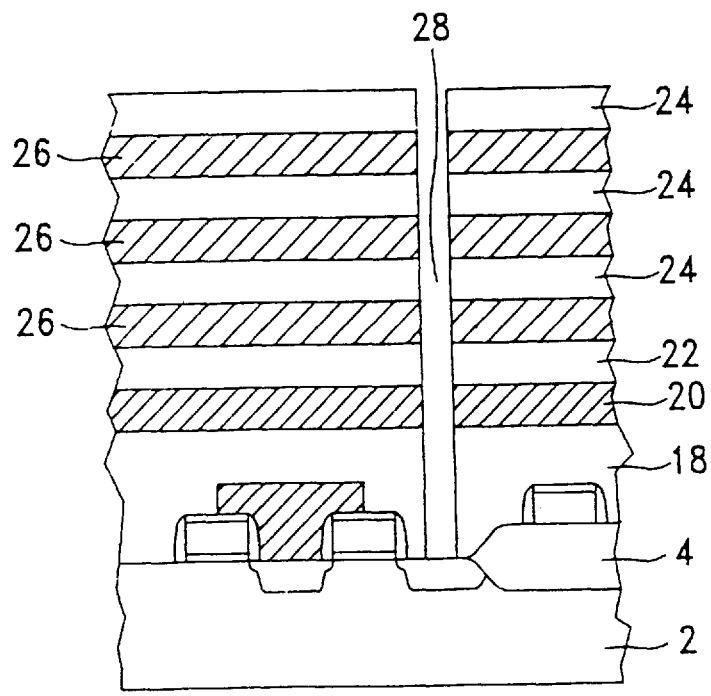
FIG. 4 is a cross section view of a semiconductor wafer illustrating the step of forming a contact hole in the composition layer, nitride layer and in the dielectric layer.

Turning next to FIG. 4, a first photoresist is pattern on the composition layer to expose a region where will be generated a contact hole for subsequent process. Then an etching is used to etch the compositon layer, the first polysilicon layer 22, the nitride layer 20 and the dielectric layer 18 back until the substrate is reached to formed a contact hole 28. In this embodiment, a plasma etching is performed to creat the contact hole 28 for storage node contact. The etchant to etch polysilicon is $SiCl_4/Cl_2$, $BCl_3/Cl_2$, $HBr/Cl_2/O_2$, $HBr/O_2$, $Br_2/SF_6$ or $SF_6$. The etchant to removed oxide is selected from the group of $CCl_2F_2$, $CHF_3/CF_4$, $CHF_3/O_2$, $CH_3CHF_2$, $CF_4/O_2$, while the nitride layer is removed by using $CF_4/H_2$, $CHF_3$ or $CH_3CHF_2$. By controlling the recipe of the reaction gas the composition layer, the nitride layer 20 and the dielectric layer 18 will be etched away respectively. Then the first photoresist is stripped away.

Figure 5:
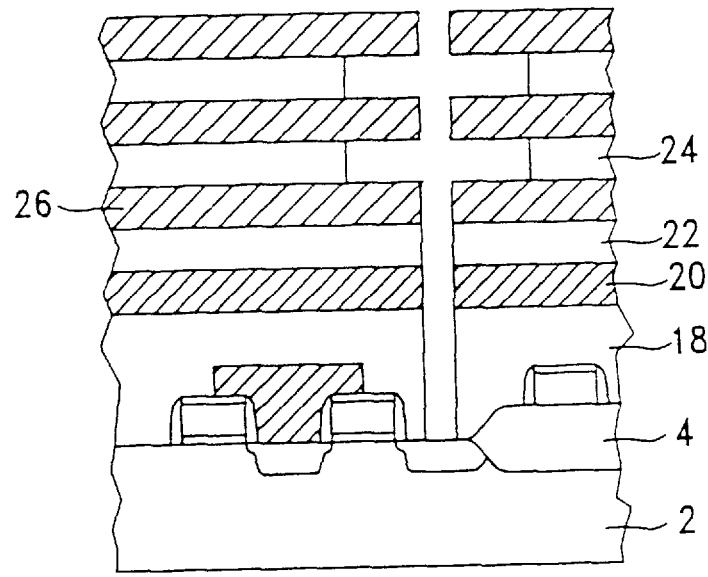
FIG. 5 is a cross section view of a semiconductor wafer illustrating the step of selectively etching the BPSG layers of the composition layer.

Next, referring to FIG. 5, a highly selective etching process is then used to removed a portion of the BPSG layers 24. An important key of the present invention is that the etching rate of BPSG to etching is much greater than that of silicon dioxide. In preferred embodiment, the selective etching step utilizes a low pressure HF vapor to selectively etch the BPSG layers 24 and silicon dioxide layers 26. The relative susceptibility to etching of the BPSG layers 24 to the silicon dioxide layers 26 is about 2000 to 1. In addition, the susceptability of BPSG to etching is also much greater than that of BSG, thus the BSG layer can be used to replace the silicon dioxide layer. Therefore, the BPSG layers 24 is etched away much more significantly than the silicon dioxide layers 26.

Figure 6:
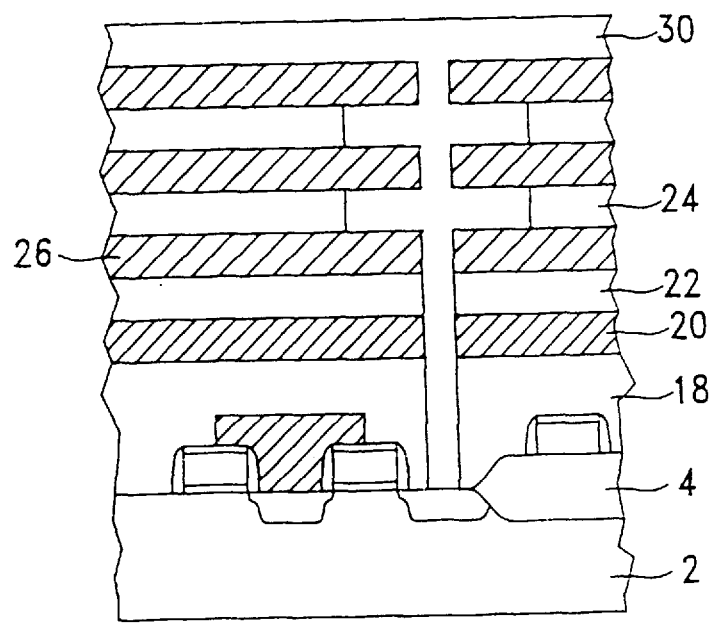
FIG. 6 is a cross section view of a semiconductor wafer illustrating the step of forming a second conductive layer on the composition layer.

Referring to FIG. 6, a second conductive layer 30 is deposited using a conventional process over the composition layer and the second conductive layer 30 is also formed between the BPSG layers 24 and the silicon dioxide layers 26. In this embodiment, the second conductive layer 30 has a thickness between 300 to 3000 angstroms. The second conductive layer 30 can be chosen from doped polysilicon, in-situ doped polysilicon, aluminum, copper, tungsten, or titanium.

Figure 7:
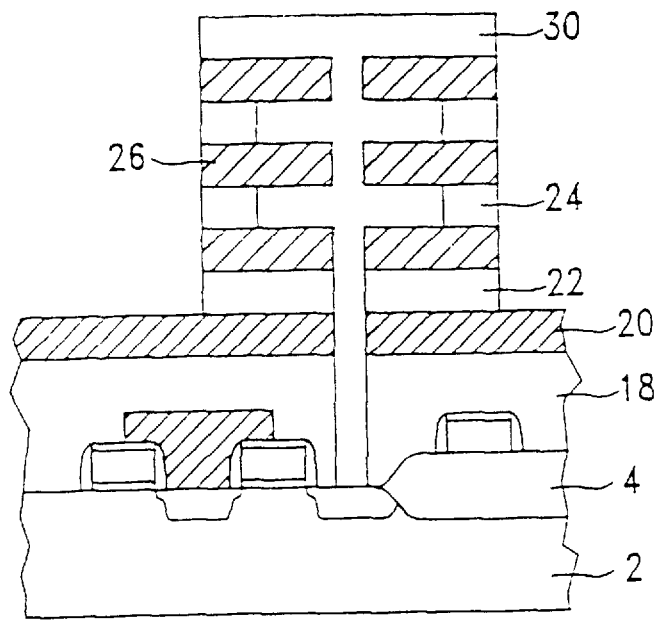
FIG. 7 is a cross section view of a semiconductor wafer illustrating the step of etching the composition layer and the second conductive layer.

Next, referring to FIG. 7, a second photoresist is patterned on the second conductive layer 30. Similarily, dry etching is used to etch the compositon layer, the first polysilicon layer 22, the nitride layer 20 and the dielectric layer 18 to the surface of the first conductive layer 22 and by controlling the recipe of the reaction gas the composition layer, the nitride layer 20 and the dielectric layer 18 will be etch away respectively. In preferred embodiment, the etchant of the etch is similar to the step to form the contact hole 28. Then the second photoresist is removed away.

Figure 8:
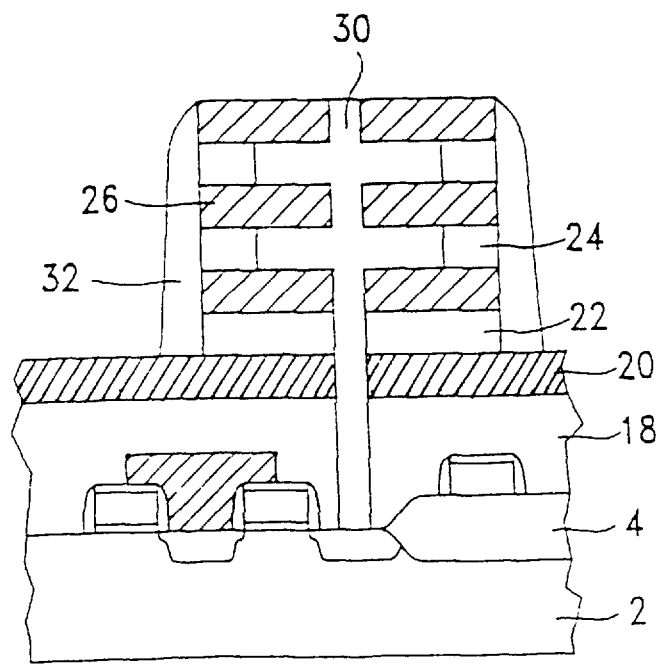
FIG. 8 is a cross section view of a semiconductor wafer illustrating the step of etching the second conductive layer and the third conductive layer.

Turning to FIG. 8, a third conductive layer 32 is subsequently formed on the composition layer and the first conductive layer 22. The third conductive layer 32 is also selected from doped polysilicon, in-situ doped polysilicon, aluminum, copper, tungsten, or titanium. Then an anisotropic etching is used to etch the third polysilicon layer 32, the second polysilicon layer 30 to the surface of the composition layer. Preferably, the etchant of the etch is $SiCl_4/Cl_2$, $BCl_3/Cl_2$, $HBr/Cl_2/O_2$, $HBr/O_2$, $Br_2/SF_6$, $CF_4$.

Figure 9:
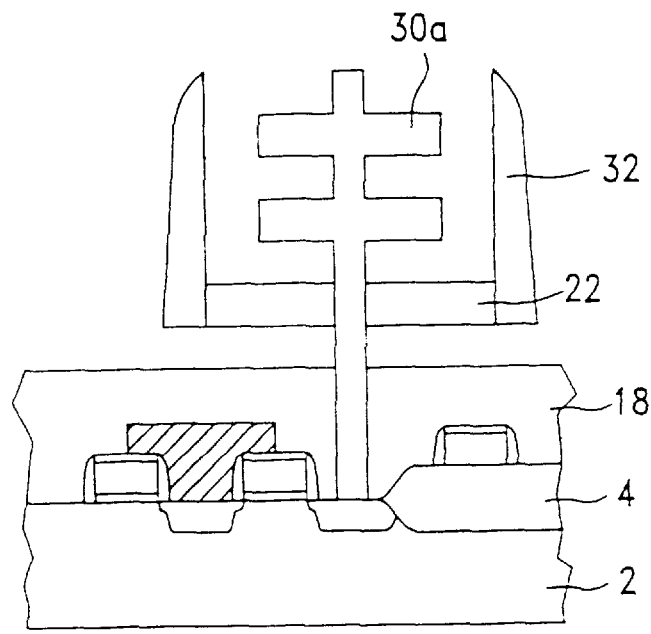
FIG. 9 is a cross section view of a semiconductor wafer illustrating the step of removing the BPSG and CVD silicon dioxide composition layers and pad nitride layer.

As be seen in FIG. 9, the BPSG layers 24 and the silicon dioxide layers 26 are removed using a BOE (buffer oxide etching) solution to form a crown shape 32 with a plurality of horizontal fins 30a. Further, in order to attain more surface area of the bottom storage node, the nitride layer 20 can be stripped away using hot phosphorus acid solution ($H_3PO_4$). The resulting structure is shown in FIG. 9.

Figure 10:
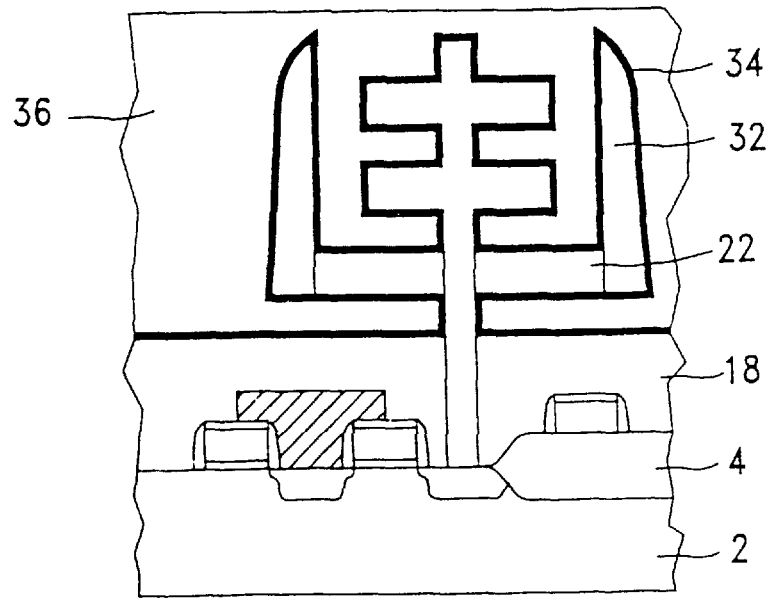
FIG. 10 is a cross section view of a semiconductor wafer illustrating the step of forming a dielectric layer on the first conductive layer and forming a second conductive layer on the dielectric layer.

Turning next to FIG. 10, the next step of the formation is the deposition of a dielectric film 34 along the surface of the first conductive layers 22, the second conductive layers 30 and the third conductive layers 32. Typically, the dielectric film 34 is preferably formed of either a double film of nitride/oxide film, a triple film of oxide/nitride/oxide, or any other high dielectric film such as tantalum oxide($Ta_2O_5$), BST, PZT, PLZT. Finally, still referred to FIG. 10, a forth conductive layer 36 is deposited over the dielectric film 30. The forth conductive layer 36 is used as the top storage node and is formed of doped polysilicon, in-situ doped polysilicon, aluminum, copper, tungsten or titanium.

The present invention uses the high etching selectivity between BPSG and CVD silicon dioxide to fabricate the capacitor. Further, a crown shape structure with fins increases the surface area of the capacitor. Therefore the present invention increases the performance of the capacitor.

As is understood by a person skilled in the art, the foregoing preferred embodiment of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for manufacturing an integrated circuit capacitor, the method comprising the steps of:

forming a first conductive layer over a semiconductor substrate;

forming a composition layer with a plurality of sublayers on said first conductive layer, said composition layer including a plurality of sublayers, at least two of said sublayers having a susceptibility to etching that differs;

forming a contact hole in said composition layer and said first conductive layer to said substrate;

selectively etching said composition layer through said contact hole to etch one of said at least two of said sublayers;

forming a second conductive layer on said composition layer, in said contact hole;

patterning a photoresist on said second conductive layer;

etching said second conductive layer, said composition layer and said first conductive layer using said photoresist as an etching mask;

removing said photoresist; then forming a third conductive layer on said second conductive layer, said composition layer, and said first conductive layer;

etching said second conductive layer, said third conductive layer to expose a top sublayer of said composition layer;

removing said composition layer;

forming a dielectric film on the surface of said first conductive layer, second conductive layer and said third conductive layer; and forming a forth conductive layer over said dielectric film.

2. The method of claim 1, further comprises following steps before forming said first conductive layer:

forming a dielectric layer on said substrate; and forming a nitride layer on said dielectric layer.

3. The method of claim 1, further comprises a step of removing said nitride layer before forming said dielectric film.

4. The method of claim 1, wherein said sublayers are further grouped into odd sublayers and even sublayers, and said odd sublayers are BPSG and said even sublayers are silicon dioxide.

5. The method of claim 1 wherein said sublayers are further grouped into odd sublayers and even sublayers, and said odd sublayers are BPSG and said even sublayers are BSG.

6. The method of claim 1, wherein said sublayers are further grouped into odd sublayers and even sublayers, and said even sublayers are BPSG and said odd sublayers are silicon dioxide.

7. The method of claim 1 wherein said sublayers are further grouped into odd sublayers and even sublayers, and said even sublayers are BPSG and said odd sublayers are BSG.

8. The method of claim 1, wherein said first conductive layer has a thickness about 300–3000 angstroms.

9. The method of claim 2, wherein said dielectric layer is formed of silicon oxide.

10. The method of claim 9, wherein said dielectric layer has a thickness about 3000–10000 angstroms.

11. The method of claim 4, wherein said BPSG sublayers have a thickness of a range between 300–1000 angstroms, said silicon dioxide layers have a thickness of a range between 300–1000 angstroms.

12. The method of claim 11, wherein the step of etching the composition layer is done with a low pressure HF vapor.

13. The method of claim 5, wherein said BPSG sublayers have a thickness of a range between 300–1000 angstroms, said BSG layers have a thickness of a range between 300–1000 angstroms.

14. The method of claim 13, wherein the step of etching the composition layer is done with a low pressure HF vapor.

15. The method of claim 6, wherein said BPSG sublayers have a thickness of a range between 300–1000 angstroms, said silicon dioxide layers have a thickness of a range between 300–1000 angstroms.

16. The method of claim 15, wherein the step of etching the composition layer is done with a low pressure HF vapor.

17. The method of claim 7, wherein said BPSG sublayers have a thickness of a range between 300–1000 angstroms, said silicon dioxide layers have a thickness of a range between 300–1000 angstroms.

18. The method of claim 17, wherein the step of etching the composition layer is done with a low pressure HF vapor.

19. The method of claim 1, wherein said second conductive layer is also formed between said plurality of sublayers.

20. The method of claim 1, wherein said second conductive layer has a thickness of a range between 300–3000 angstroms.

21. The method of claim 1, wherein the step of removing said composition layer is done using a BOE (buffer oxide etching) solution.

22. The method of claim 1, wherein said third conductive layer has a thickness of a range between 300–3000 angstroms.

23. The method of claim 1, wherein said forth conductive layer has a thickness of a range between 500–3000 angstroms.

24. The method of claim 1, wherein said dielectric film is formed of tantalum oxide($Ta_2O_5$).

25. The method of claim 1, wherein said dielectric film is formed of a triple film of oxide/nitride/oxide.

26. The method of claim 1, wherein said dielectric film is formed of a double film of nitride/oxide film.

27. The method of claim 1, wherein said dielectric film is formed of BST.

28. The method of claim 1, wherein said dielectric film is formed of PZT or PLZT.

29. The method of claim 1, wherein said first conductive layer, said second conductive layer, said third conductive layer and forth conductive layer are selected from the group of doped polysilicon, in-situ doped polysilicon, aluminum, copper, tungsten, and titanium combinations thereon.

30. A method for manufacturing an integrated circuit capacitor, the method comprising the steps of:

forming a first conductive layer over a semiconductor substrate;

forming a composition layer that consists of alternating sublayers of BPSG sublayers and silicon dioxide sublayers on said first conductive layer;

forming a contact hole in said composition layer and said first conductive layer;

etching said composition layer through said contact hole using highly selective etching to etch said BPSG layers;

forming a second conductive layer in said contact hole and over said composition layer;

patterning a photoresist on said second conductive layer;

etching said second conductive layer, composition layer and first conductive layer using said photoresist as an etching mask;

stripping said photoresist; then forming a third conductive layer on said second conductive layer, said composition layer, and said first conductive layer;

etching said third conductive layer and said second conductive layer to expose a top of said composition layer;

removing said composition layer;

forming a dielectric film on the surface of said first conductive layer, third conductive layer and said second conductive layer; and forming a forth conductive layer over said dielectric film.

31. The method of claim 30, wherein the step of etching the composition layer is done with a low pressure HF vapor.

32. The method of claim 30, wherein the step of removing said composition layer is done using a BOE (buffer oxide etching) solution.

33. The method of claim 30, wherein said BPSG sublayers have a thickness of a range between 300–1000 angstroms, said silicon dioxide layers have a thickness of a range between 300–1000 angstroms.

34. A method of forming a crown shape polysilicon with a plurality of fins comprising the steps of:

forming a first polysilicon layer on a substrate;

forming a composition layer that consists of alternating BPSG layers and silicon dioxide layers on said first polysilicon layer;

forming a hole through said composition layer and said first polysilicon layer to said substrate;

using high selective etching to selectively etch said BPSG layers through said contact hole;

forming a second polysilicon layer on said substrate, in said hole and over said composition layer;

patterning a photoresist on said second polysilicon ayer;

etching said second polysilicon layer, said composition layer and said first polysilicon layer using said photoresist as an etching mask;

removing said photoresist; then forming a third polysilicon layer on said second polysilicon layer, said composition layer, and said first polysilicon layer;

etching said third polysilicon layer, second polysilicon layer to expose a top layer of said composition layer; and removing said composition layer.

35. The method of claim 34, wherein the step of etching the composition layer is done with a low pressure HF vapor.

36. The method of claim 34, wherein the step of removing said composition layer is done using a BOE (buffer oxide etching) solution.

* * * * *